United States Patent
Wen et al.

(10) Patent No.: US 11,644,313 B2
(45) Date of Patent: May 9, 2023

(54) SUBSTRATE-DECOUPLED HIGH-CORIOLIS-COUPLING PITCH/ROLL GYROSCOPE

(71) Applicant: Georgia Tech Research Corporation, Atlanta, GA (US)

(72) Inventors: Haoran Wen, Atlanta, GA (US); Farrokh Ayazi, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 178 days.

(21) Appl. No.: 16/644,389

(22) PCT Filed: Sep. 7, 2017

(86) PCT No.: PCT/US2017/050442
§ 371 (c)(1),
(2) Date: Mar. 4, 2020

(87) PCT Pub. No.: WO2019/050517
PCT Pub. Date: Mar. 14, 2019

(65) Prior Publication Data
US 2021/0063157 A1    Mar. 4, 2021

(51) Int. Cl.
*G01C 19/5684*    (2012.01)
*B81B 7/02*    (2006.01)
*G01C 19/5698*    (2012.01)

(52) U.S. Cl.
CPC ............ *G01C 19/5684* (2013.01); *B81B 7/02* (2013.01); *G01C 19/5698* (2013.01); *B81B 2201/0242* (2013.01); *B81B 2201/0271* (2013.01)

(58) Field of Classification Search
CPC ............ G01C 19/5719; G01C 19/5698; G01C 19/5677; G01C 19/5684; H03H 9/02228
See application file for complete search history.

(56) References Cited

U.S. PATENT DOCUMENTS

| | | | | |
|---|---|---|---|---|
| 7,119,636 B2 * | 10/2006 | Nguyen | ............... | H03H 9/2436 333/186 |
| 8,040,207 B2 * | 10/2011 | Winkler | .................. | G04F 5/063 310/309 |
| 8,166,816 B2 | 5/2012 | Ayazi et al. | | |

(Continued)

FOREIGN PATENT DOCUMENTS

| | | |
|---|---|---|
| JP | 2009-529820 A | 8/2009 |
| WO | 2016/201413 A1 | 12/2016 |

(Continued)

OTHER PUBLICATIONS

Ayazi et al. "High Aspect-Ratio Combined Poly and Single-Crystal Silicon (HARPSS) MEMS Technology" Journal of Microelectromechanical Systems 9(3):288-294 (Sep. 2000).

(Continued)

*Primary Examiner* — Helen C Kwok
(74) *Attorney, Agent, or Firm* — Myers Bigel, P.A.

(57) ABSTRACT

A microelectromechanical resonator includes a resonator member suspended over a surface of a substrate by at least one anchor that is connected to the substrate. The resonator member includes outer and inner frames that are concentrically arranged and mechanically coupled by support structures extending therebetween. Related apparatus and gyroscopes are also discussed.

15 Claims, 6 Drawing Sheets

(56) References Cited

U.S. PATENT DOCUMENTS

| | | | |
|---|---|---|---|
| 8,763,441 | B2 | 7/2014 | Casinovi et al. |
| 9,726,489 | B2 | 8/2017 | Ayazi et al. |
| 2004/0123661 | A1* | 7/2004 | Painter ............... G01C 19/5719 73/504.13 |
| 2005/0174197 | A1* | 8/2005 | Nguyen ............... H03H 9/2436 333/186 |
| 2007/0070821 | A1* | 3/2007 | Weigold ............... H03H 9/2431 368/168 |
| 2011/0094302 | A1* | 4/2011 | Schofield ............... G01C 19/56 73/504.12 |
| 2012/0048017 | A1* | 3/2012 | Kempe ............... G01C 19/5747 73/504.12 |
| 2012/0227487 | A1* | 9/2012 | Ayazi .................... G01C 19/56 216/6 |
| 2013/0283911 | A1* | 10/2013 | Ayazi .................... G01C 19/56 73/504.12 |
| 2013/0293319 | A1 | 11/2013 | Winkler et al. |
| 2013/0319116 | A1 | 12/2013 | Johari-Galle |
| 2014/0224016 | A1* | 8/2014 | Leclerc ............... G01C 19/5712 73/504.12 |
| 2015/0214462 | A1* | 7/2015 | Zolfagharkhani .... H01L 41/107 310/369 |
| 2015/0377621 | A1* | 12/2015 | Chau .................... G01C 19/574 73/504.16 |
| 2016/0084654 | A1* | 3/2016 | Senkal ............... G01C 19/5726 73/502 |
| 2016/0334213 | A1* | 11/2016 | DeWall ............... G01C 19/5684 |
| 2018/0321037 | A1* | 11/2018 | Wen .................... G01C 19/5719 |

FOREIGN PATENT DOCUMENTS

| | | |
|---|---|---|
| WO | 2017/075413 A1 | 5/2017 |
| WO | 2018/057071 A1 | 3/2018 |

OTHER PUBLICATIONS

Ayazi, Farrokh "Multi-DOF inertial MEMS: From gaming to dead reckoning" 2011 16th International Solid-State Sensors, Actuators and Microsystems Conference (pp. 2805-2808) (Jun. 2011).

Pourkamali et al. "Low-impedance VHF and UHF Capacitive Silicon Bulk Acoustic Wave Resonators—Part I Concept and Fabrication" IEEE Transactions on Electron Devices 54(8):2017-2023 (Aug. 2007).

Pourkamali et al. "Low-Impedance VHF and UHF Capacitive Silicon Bulk Acoustic-Wave Resonators—Part II Measurement and Characterization" IEEE Transactions on Electron Devices 54(8):2017-2023 (Aug. 2007).

Notification of Transmittal of the International Search Report and the Written Opinion of the International Searching Authority, or the Declaration, in corresponding PCT Application No. PCT/US2017/050442 (14 pages) (Jun. 7, 2018).

Shirazi et al. "Combined Phase-Readout and Self-Calibration of MEMS Gyroscopes" 2013 Transducers & Eurosensors XXVII: The 17th International Conference on Solid-State Sensors, Actuators and Microsystems (Transducers & Eurosensors XXVII) (pp. 960-963) (Jun. 2013).

Sung et al. "A mode-matched 0.9 MHZ single proof-mass dual-axis gyroscope" 2011 16th International Solid-State Sensors, Actuators and Microsystems Conference (pp. 2821-2824) (Jun. 2011).

Gallacher et al. "Principles of a Three-Axis Vibrating Gyroscope" IEEE Transactions on Aerospace and Electronic Systems 37(4):1333-1343 (Oct. 2001).

Khaled et al. "An Electrostatic MEMS Roll-Pitch Rotation Rate Sensor with In-Plane Drive Mode" Sensors 2022 22(3):702 (Jan. 2022).

Seeger et al. "Development of High-Performance, High-Volume Consumer Mems Gyroscopes" InvenSense, Inc. (Jun. 2010).

Wen et al. "A High-Frequency Resonant Framed-Annulus Pitch or Roll Gyroscope for Robust High-Performance Single-Chip Inertial Measurement Units" Journal of Microelectromechanical Systems 27(6):995-1008 (Dec. 2018.

* cited by examiner

SUBSTRATE-DECOUPLED HIGH-CORIOLIS-COUPLING PITCH/ROLL GYROSCOPE

STATEMENT OF GOVERNMENT INTEREST

This invention was made with government support under Grant No. N66001-11-C-4176 awarded by Space and Naval Warfare Systems Center Pacific. The government has certain rights in the invention.

CROSS REFERENCE TO RELATED APPLICATION

This application is a 35 U.S.C. § 371 national stage application of PCT International Application No. PCT/US2017/050442, filed on Sep. 7, 2017, the content of which is incorporated herein by reference in its entirety. The above-referenced PCT International Application was published in the English language as International Publication No. WO 2019/050517 A1 on Mar. 14, 2019.

FIELD

The present disclosure relates to MEMS (micro-electromechanical systems), and more particularly, to MEMS resonators and related operation and fabrication techniques.

BACKGROUND

Micro-electromechanical system (MEMS) resonators can provide small form factor, ease of integration with conventional semiconductor fabrication techniques and high f·Q products. High frequency and high-Q width-extensional mode silicon bulk acoustic resonators (SiBARs) and film bulk acoustic resonators (FBARs) have demonstrated atmospheric Q factors in excess of 10,000 at or above 100 MHz, with moderate motional resistances. Bulk acoustic wave (BAW) refers to a mode of vibration that extends throughout a bulk portion of a resonator element or member. Movement of the resonator element towards a sense electrode changes the capacitive gap spacing therebetween, thereby altering the resonant frequency of the device. Such BAW resonators are described in the publication "*Low-impedance VHF and UHF Capacitive Silicon Bulk Acoustic Wave Resonators— Part I. Concept and Fabrication*" to S. Pourkamali et al., IEEE Trans. On Electron Devices, Vol. 54, No. 8, pp. 2017-2023, August 2007, the disclosure of which is incorporated herein by reference in its entirety.

Tri-axial gyroscopes are a type of MEMS resonator that may be increasingly used in handheld devices, such as smart user interfaces and gaming controllers that may require multi-dimensional motion recognition for accurate positioning. Some tri-axial gyroscopes are described in the publication "*MULTI-DOF INERTIAL MEMS: FROM GAMING TO DEAD RECKONING*" to F. Ayazi, Digest Tech. Papers Transducers'11 Conference, Beijing, China, pp. 2805-2808, 2011, the disclosure of which is incorporated herein by reference in its entirety.

While some conventional vibratory gyroscopes utilize separate proof masses for each axis' rate measurement, some gyroscopes may employ a single proof-mass for simultaneous dual-axis pitch and roll rate sensing (i.e., x- and y-axis), and may be formed, for example, using a revised version of the high-aspect-ratio polysilicon and single-crystal silicon (HARPSS)™ process. Such single-proof mass gyroscopes are described in the publication "*A MODE-MATCHED 0.9 MHZ SINGLE PROOF-MASS DUAL-AXIS GYROSCOPE*" to W. K. Sung, et al., Digest Tech. Papers Transducers'11 Conference, pp. 2821-2824, 2011, the disclosure of which is incorporated herein by reference in its entirety. The HARPSS™ process is further described in the publication "*High Aspect-Ratio Combined Poly and Single-Crystal Silicon (HARPSS) MEMS Technology*" to F. Ayazi and K. Najafi, J. Microelectromech. Syst., Vol. 9, pp. 288-294, 2000, the disclosure of which is incorporated herein by reference in its entirety. High-aspect-ratio polysilicon and single-crystal silicon (HARPSS)-on-silicon-on-insulator (SOI) silicon bulk acoustic-wave resonators are also described in the publication "*Low-Impedance VHF and UHF Capacitive Silicon Bulk Acoustic-Wave Resonators— Part II: Measurement and Characterization*" to S. Pourkamali, et al., Transactions on Electron. Devices, Vol. 54, pp. 2024-2030, 2007, the disclosure of which is incorporated herein by reference in its entirety.

BAW gyroscopes are further described in U.S. Pat. No. 8,166,816 to Ayazi et al., entitled "BULK ACOUSTIC WAVE GYROSCOPE" issued May 1, 2012, the disclosure of which is incorporated herein by reference in its entirety. A self-calibration mechanism, which relies on application of a rotating electrostatic field to first and second drive electrodes simultaneously to excite both the drive and sense resonance modes of the gyroscope (and thus does not require physical rotation of the resonant body of the gyroscope) is described in U.S. Pat. No. 8,763,441 to Casinovi et al., entitled "METHOD AND APPARATUS FOR SELF-CALIBRATION OF GYROSCOPES" issued Jul. 1, 2014, and Shirazi, et al, "Combined Phase-Readout and Self-Calibration of MEMS Gyroscopes," Digest Tech. Papers Transducers 2013 Conference, Barcelona, Spain, pp. 960-963, 2013, the disclosures of which are incorporated herein by reference in their entireties.

SUMMARY

According to some embodiments, a microelectromechanical resonator comprises a resonator member suspended over a surface of a substrate by at least one anchor that is connected to the substrate, said resonator member comprising outer and inner frames that are concentrically arranged and mechanically coupled by support structures extending therebetween.

In some embodiments, the at least one anchor may include a plurality of outer anchors that are connected to the outer frame at nodes of the resonator member for an in-plane resonance mode thereof, where movement of the resonator member in the in-plane resonance mode is parallel to the surface of the substrate.

In some embodiments, the nodes of the resonator member for the in-plane resonance mode thereof may coincide with nodes of the resonator member for an out-of-plane resonance mode thereof, where movement of the resonator member in the out-of-plane resonance mode is non-parallel to the surface of the substrate.

In some embodiments, the outer frame may be a rectangular frame, and the support structures may be beam structures that mechanically couple the inner frame thereto at corners within the rectangular frame.

In some embodiments, the at least one anchor may further include a plurality of inner anchors that are connected to the inner frame at additional nodes of the resonator member for the out-of-plane resonance mode thereof, where the additional nodes do not coincide with the nodes of the resonator member for the in-plane resonance mode thereof.

In some embodiments, the inner frame may be an annular frame, and the inner anchors may be positioned within the annular frame.

In some embodiments, the outer and inner frames of the resonator member and the at least one anchor may be formed from a single-crystal semiconductor material.

In some embodiments, the outer frame may include a first sidewall having first comb fingers protruding therefrom between the nodes of the resonator member for the in-plane resonance mode. A drive electrode of a different material may be disposed adjacent the first sidewall and may include second comb fingers that are interdigitated with the first comb fingers to define sub-micron capacitive gaps therebetween.

In some embodiments, the outer frame may include second sidewalls that are slanted at an angle relative to a plane defined by a surface thereof. Respective quadrature tuning electrodes having surfaces that are slanted at respective angles parallel to the angle may be disposed adjacent the second sidewalls and separated therefrom by respective sub-micron capacitive gaps.

In some embodiments, responsive to application of a quadrature tuning voltage to the respective quadrature tuning electrodes, a frequency of an in-plane resonance mode of the resonator member and a frequency of an out-of-plane resonance mode of the resonator member, which is orthogonal to the in-plane drive mode, may be mode-matched. That is, the resonator member may be operated at a mode-matched condition in which the resonance frequencies for an in-plane drive mode and at least one out-of-plane sense mode are located at a specific frequency.

According to some embodiments, a resonator apparatus includes a bulk acoustic wave (BAW) resonator comprising an outer resonator member and an inner resonator member within a perimeter of the outer resonator member. The inner resonator member and the outer resonator member are mechanically coupled by support structures extending therebetween. The resonator apparatus further includes anchor structures that are coupled to a substrate and suspend the BAW resonator over a surface of the substrate.

In some embodiments, the support structures and/or the anchor structures may be configured to distribute an effective mass of the BAW resonator such that anti-nodes for an out-of-plane resonance mode thereof coincide with anti-nodes for an in-plane resonance mode thereof. Movement of the BAW resonator in the in-plane and out-of-plane resonance modes thereof is parallel and non-parallel to a surface of the substrate, respectively.

In some embodiments, the anchor structures may include outer anchors that are connected to the outer resonator member outside the perimeter at nodes of the BAW resonator for the in-plane resonance mode thereof that coincide with nodes of the BAW resonator member for the out-of-plane resonance mode thereof.

In some embodiments, the anchor structures may further include inner anchors that are connected to the inner resonator member inside the perimeter at additional nodes of the BAW resonator for the out-of-plane resonance mode thereof that do not coincide with the nodes of the BAW resonator for the in-plane resonance mode thereof.

In some embodiments, the outer and inner resonator members may be concentrically arranged and at least one of the outer resonator member or the inner resonator may be defined by a rectangular frame. The support structures may be defined by beam structures that mechanically couple the outer and inner resonator members at corners of the rectangular frame.

In some embodiments, the anchor structures may further include tether structures extending between the outer anchors and the outer resonator member and/or between the inner anchors and the inner resonator member in serpentine manner to suspend the resonator over the surface of the substrate.

In some embodiments, the resonator apparatus may include or be part of an inertial measurement unit (IMU). The BAW resonator may be a first resonator member of a first gyroscope, and a second resonator member of a second gyroscope having outer and inner resonator members may be disposed on the substrate. At least one anchor structure may suspend the second resonator member over the surface of the substrate adjacent the first resonator member.

According to some embodiments, a pitch or roll gyroscope includes a resonator member, and at least one anchor structure connected to a substrate. The at least one anchor structure suspends the resonator member over a surface of the substrate such that the resonator member is decoupled from the substrate for an in-plane resonance mode thereof comprising movement parallel to the surface of the substrate and out-of-plane resonance mode thereof comprising movement non-parallel to the surface of the substrate. A Coriolis force on the resonator member in the in-plane resonance mode thereof coincides with deformation of the resonator member in the out-of-plane resonance mode thereof.

In some embodiments, the resonator member may have an effective mass that is distributed to provide angular momentum balancing and Coriolis coupling (for example, of greater than about two-thirds of the effective mass) between the in-plane resonance mode and the out-of-plane resonance mode.

In some embodiments, an effective mass of the resonator member may be distributed such that anti-nodal points of the resonator member for the out-of-plane resonance mode thereof coincide with anti-nodal points of the resonator member for the in-plane resonance mode thereof.

In some embodiments, the resonator member may include concentric frame members having annular or rectangular shapes that are mechanically coupled by beam structures extending therebetween. The concentric frame members may be balanced in momentum and angular momentum for the in-plane resonance mode and the out-of-plane resonance mode.

In some embodiments, the at least one anchor structure may include outer anchors that are outside of a perimeter of the resonator member and are positioned at nodal points of the resonator member for the in-plane resonance mode thereof that coincide with nodal points of the resonator member for the out-of-plane resonance mode thereof. The outer anchors may not provide a balancing force on the resonator member for the in-plane resonance mode and the out-of-plane resonance mode.

In some embodiments, a ratio between the Coriolis force coupled mass on the resonator member and the effective mass in the out-of-plane resonance mode may be about 0.85 or more.

Other apparatus and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION

Example embodiments of the present disclosure are directed to pitch or roll gyroscope designs, with particular embodiments directed to bulk acoustic wave (BAW) resonator-based pitch or roll gyroscope designs where movement of the resonator element towards a sense electrode changes the capacitive gap spacing therebetween, thereby providing an electrical output signal. Such embodiments can improve performance of pitch/roll gyroscopes by combining substrate-decoupling with high-Coriolis coupling. Embodiments of the present disclosure may employ one or more proof-masses for simultaneous dual-axis pitch and roll rate sensing (i.e., x- and y-axis), and may be formed, for example, using a high-aspect-ratio polysilicon and single-crystal silicon (HARPSS)™ process. While described primarily herein by way of example with reference to pitch/roll BAW gyroscopes having a resonator member including two or more concentric frames, it will be understood that the inventive concepts of the present disclosure are not so limited. More generally, embodiments of the present disclosure are applicable to any BAW resonator or inertial measurement apparatus that include drive electrodes, sense electrodes, tuning electrodes, and/or tether structures.

As described herein, movement or motion of a resonator member in an in-plane (IP) direction or resonance mode of vibration is parallel to a plane defined by a surface of a substrate to which the resonator member is anchored (also referred to herein as in-plane motion), while movement or motion of the resonator member in an out-of-plane (OOP) direction or resonance mode of vibration is non-parallel to the plane defined by the surface of the anchor substrate (also referred to herein as out-of-plane motion). Nodal points (or "nodes") refer to locations of the resonator member that experience close to zero displacement in a specific mode, while anti-nodal points (or "anti-nodes") refer to locations of the resonator member that experience maximum displacement in a mode.

Inertial-grade MEMS gyroscopes, and in particular pitch/roll gyroscopes, may be desirable in the current market. For example, if performance of pitch/roll gyroscopes can be improved to meet navigation requirements, a market of various consumer applications with more than 100 million in volume per year may be expected.

Figure 8:
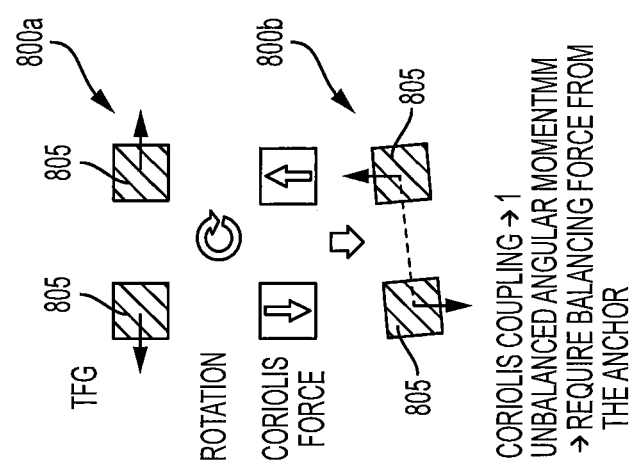
FIG. 8 illustrates Coriolis forces and displacement of a resonator member in an in-plane drive mode and an out-of-plane sense mode of a conventional tuning fork gyroscope.

Tuning-fork pitch/roll gyroscopes may be used in commercial gyroscopes due to high Coriolis coupling between the drive motion and sense motion (e.g., a Coriolis coupling coefficient of approximately or approaching 1). FIG. 8 illustrates an in-plane drive mode 800a and an out-of-plane sense mode 800b of a conventional tuning fork gyroscope TFG. As shown in FIG. 8, in the in-plane mode 800a, the tuning fork gyroscope TFG is actuated such that it is resonator member 805 moves or rotates in a direction that is parallel to an underlying substrate to which the resonator member 805 is anchored. The Coriolis force produced by the resonator member 805 responsive to the in-plane motion under rotation largely coincides with deformation of the resonator member 805 in the out-of-plane mode, as shown in FIG. 8. However, the out-of-plane mode 800b of the tuning-fork pitch/roll gyroscope TFG has an unbalanced angular momentum, which requires a balancing force provided by an anchor member. The tuning-fork pitch/roll gyroscope TFG thus cannot be decoupled from the underlying substrate, and may suffer from poor vibration rejection and environmental robustness.

Figure 9:
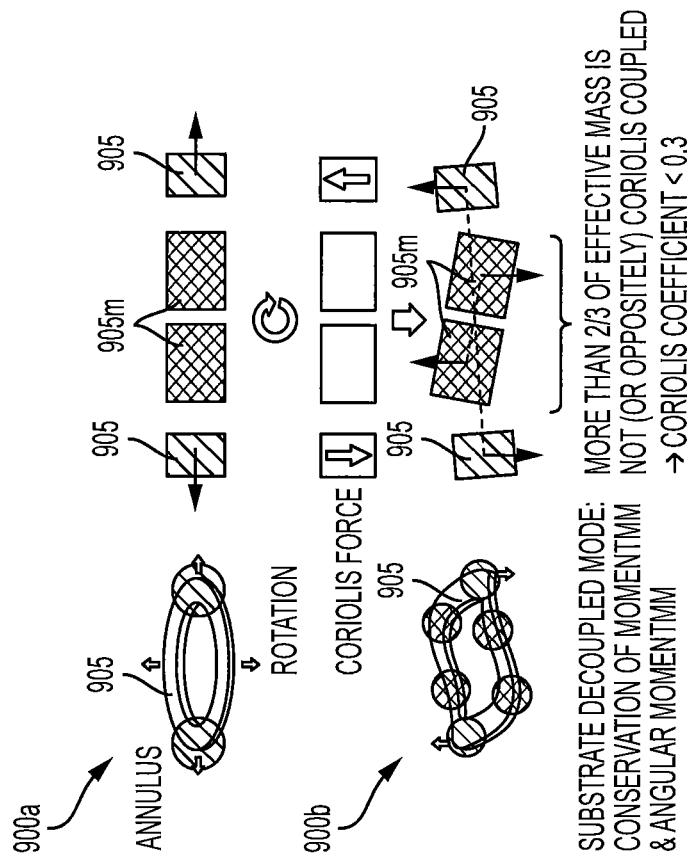
FIG. 9 illustrates Coriolis forces and displacement of a resonator member in an in-plane drive mode and an out-of-plane sense mode of a conventional BAW annulus pitch/roll gyroscope.

Mode-matched annulus BAW gyroscopes may be candidates for inertial-grade pitch/roll gyroscopes due, for example, to their robustness and vibration resistance. FIG. 9 illustrates an in-plane drive mode 900a and an out-of-plane sense mode 900b of a conventional BAW annulus pitch/roll gyroscope. The BAW annulus pitch/roll gyroscope has a substrate-decoupled high-frequency mode and improved environmental robustness. The substrate-decoupled BAW annulus pitch/roll gyroscope includes an active resonator member 905 anchored through a stress isolation system, which is configured to effectively decouple the gyroscope from the underlying substrate to which it is anchored at the resonance frequency of the modes of vibration. As shown in FIG. 9, in the in-plane mode 900a, the BAW annulus pitch/roll gyroscope is actuated such that it is resonator member 905 moves or rotates in a direction that is parallel to the underlying substrate. Electrodes with narrow capacitive gaps may be provided at a perimeter of the resonator member 905 to allow electrostatic excitation, readout, and frequency tuning.

However, the substrate-decoupled mode shape of the out-of-plane mode 900b of the BAW annulus pitch/roll gyroscope has extra or additional effective mass 905m (for angular momentum balancing) that is not Coriolis coupled to the drive mode. In particular, more than about two-thirds 905m of the effective mass of the resonator 905 is not (or is oppositely) Coriolis coupled. As such, performance (such as scale factor and noise performance) of the BAW annulus pitch/roll gyroscope may be limited by a relatively low Coriolis coupling (e.g., a Coriolis coupling coefficient of less than about 0.3) between the Coriolis force on the resonator member 905 in the in-plane drive mode 900a and the out-of-plane sense mode 900b.

Embodiments of the present disclosure provide pitch/roll gyroscope configurations with substrate-decoupled mode shapes and a high Coriolis coupling coefficient (e.g., up to 1), which can improve the scale factor and noise performance of the gyroscope while keeping the advantage of high robustness of BAW gyroscopes. In a particular example, a substrate-decoupled high-Coriolis-coupling pitch/roll gyroscope in accordance with embodiments of the present disclosure includes two frames (for example, shaped as an annulus and/or rectangle) that are concentrically arranged and mechanically coupled through support structures (such as beam structures). The gyroscope has two Coriolis-coupled resonance modes. For the in-plane mode, the two frames resonate in a coupled anti-phase n=2 mode. For the out-of-plane mode, the two frames resonate in a coupled anti-phase like-teeter-totter mode.

Figure 1:
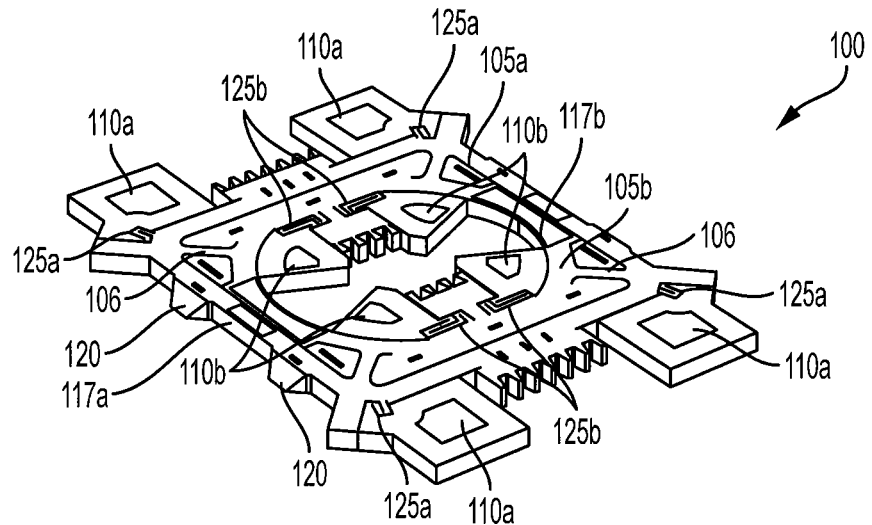
FIG. 1 is a perspective view illustrating a bulk acoustic wave (BAW) resonator apparatus that is configured as a high-Coriolis coupling pitch/roll gyroscope in accordance with some embodiments of the present disclosure.
Figure 2:
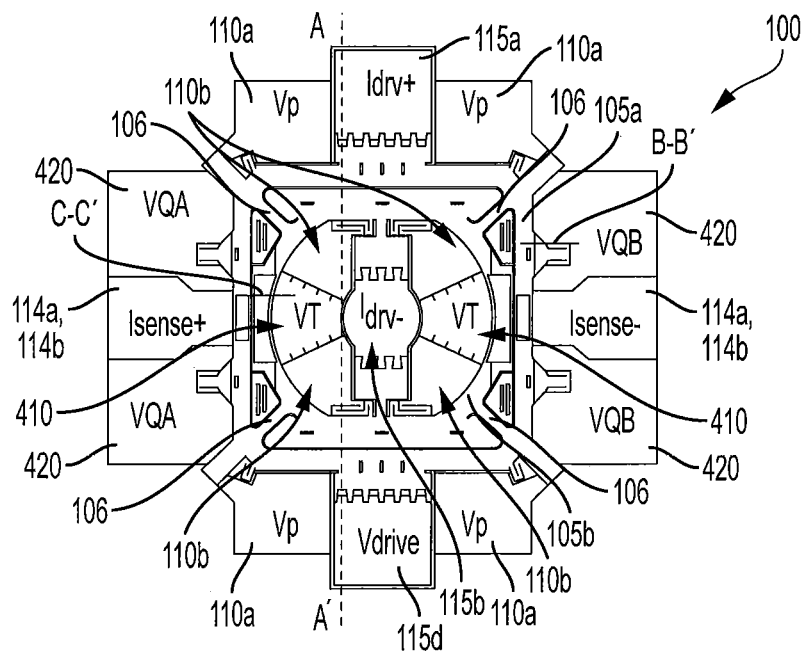
FIG. 2 is a plan view of the BAW resonator apparatus of FIG. 1 in accordance with some embodiments of the present disclosure.
Figure 3:
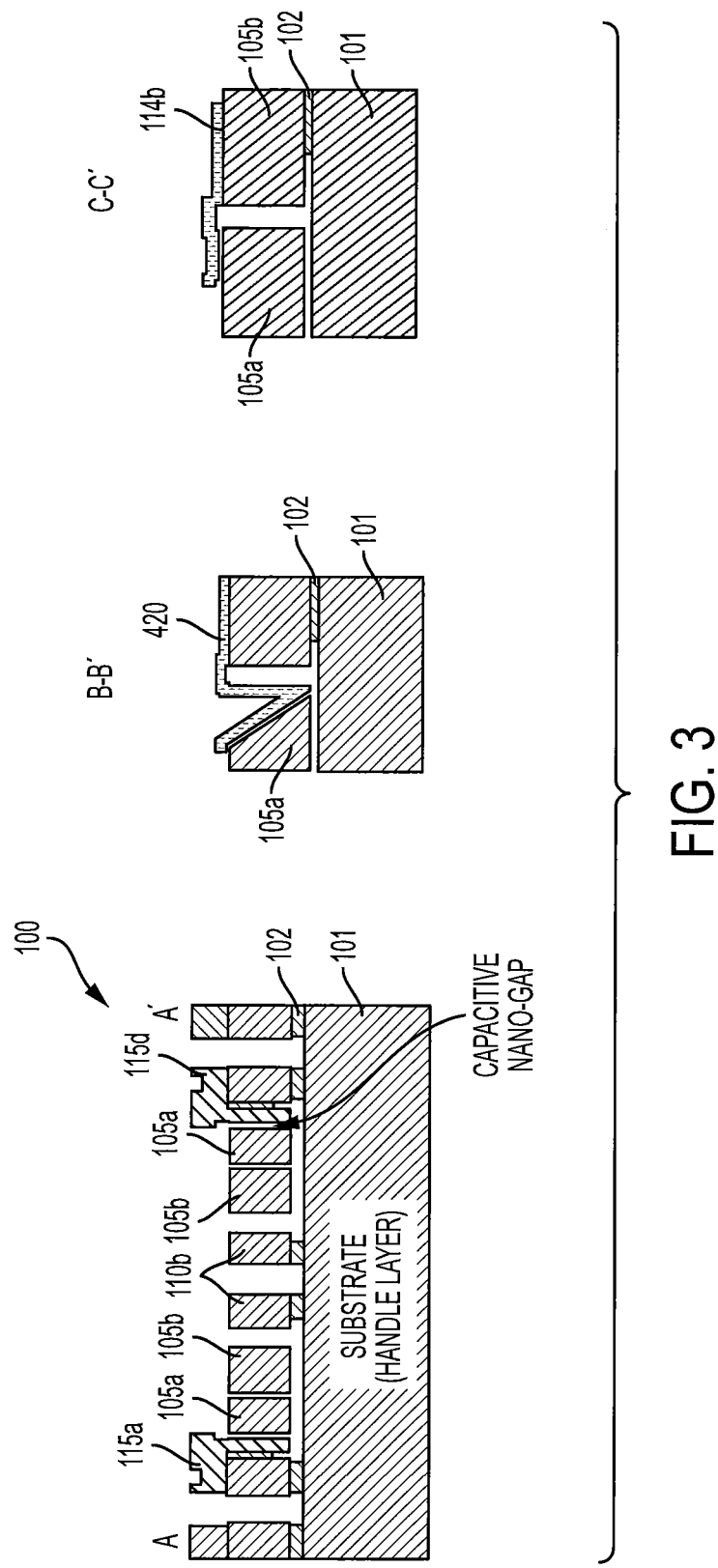
FIG. 3 is a cross-sectional view of the BAW resonator apparatus of FIG. 2 in accordance with some embodiments of the present disclosure, taken along line A-A' of FIG. 2.

FIG. 1 is a perspective view illustrating a bulk acoustic wave (BAW) resonator apparatus 100 that is configured as a pitch/roll gyroscope in accordance with some embodiments of the present disclosure. FIG. 2 is a plan view of the BAW resonator apparatus 100 of FIG. 1, and FIG. 3 is a cross-sectional view of the BAW resonator apparatus 100 taken along line A-A' of FIG. 2. More particularly, the views shown in FIGS. 1-3 illustrate the geometry and electrode configuration of an example substrate-decoupled high-Coriolis-coupling pitch/roll gyroscope 100 in accordance with some embodiments of the present disclosure.

As shown in FIGS. 1-3, the BAW resonator apparatus 100 includes an outer resonator member or outer frame 105a, and an inner resonator member or inner frame 105b that is arranged within a perimeter 117a of the outer resonator member 105a. The outer resonator member 105a and the inner resonator member 105b are mechanically coupled by support structures 106 (illustrated as having beam-shapes) extending therebetween. Outer and inner anchor structures 110a, 110b connect the outer and inner resonator members 105a, 105b to a substrate 101 by portions of a layer 102 (described herein by way of example as a buried oxide layer (BOX)). In the example embodiments illustrated herein, the outer resonator member 105a defines a rectangular outer frame and the inner resonator member 105b defines an annular or elliptical inner frame; however, it will be understood these shapes are provided by way of example, and that outer and inner resonator members 105a, 105b in accordance with embodiments of the present disclosure are not limited to such shapes.

The anchor structures 110a, 110b are likewise shown by way of example as being connected to the resonator members 105a, 105b at four locations each, but it will be understood that embodiments of the present disclosure may include fewer or additional anchor structures and/or fewer or additional connections to the interior and/or exterior of the resonator members 105a, 105b. The outer anchor structures 110a are connected to the outer resonator member 105a by respective outer tether structures 125a that are located outside the perimeter 117a of the outer resonator member 105a, while the inner anchor structures 110b are connected to the inner resonator member 105b by respective inner tether structures 125b that are located within a perimeter 117b of the inner resonator member 105b. In some embodiments, the tether structures 125a, 125b may have different shapes. For example, the shapes of the tether structures 125a, 125b may be locally engineered to allow desired movement of the resonator members 105a, 105b to which they are coupled. The BAW resonator apparatus 100 may have a resonance frequency of greater than 200 kHz, and in some embodiments, about 1 MHz or more.

As shown in FIG. 2, the resonator members 105a, 105b are configured for placement of respective electrodes at various positions around the perimeter 117a and/or within the perimeter 117b to provide drive, sense, and tuning functions. In particular, in the example of FIG. 2, the apparatus 100 includes three comb-drive elements 115d, 115a, 115b. The comb-drive element 115d is a drive or excitation electrode configured to be applied with a drive voltage $V_{Drive}$ to actuate the resonator members 105a, 105b in the in-plane drive mode, and the comb-drive elements 115a and 115b are sense or monitor electrodes that are configured to output currents $I_{drv+}$ and $I_{drv-}$ in response to movement of the resonator members 105a, 105b. Top electrodes 114a and 114b are configured to output currents $I_{Sense+}$ and $I_{Sense-}$ for differential output to reject common-mode errors. Displacements of the resonator members 105a and 105b can be determined from the output currents.

The perimeter 117a of the outer resonator member 105a is further defined by respective sidewalls 120 that are slanted at an angle relative to a plane defined by a surface of the resonator member 105a, where the angle corresponds to or is otherwise adapted to mate with slanted quadrature tuning electrodes 420. The angle of the slanted sidewall 120 may be about 30° to about 60°, for example, 45°. In some embodiments where the outer resonator member 105a is formed from single crystal silicon (SCS), the angle of the slanted sidewall 120 is defined by the (111) crystal plane (relative to the (100) crystal plane) to be about 54.7°. This angle may be achieved, for example, by using a wet etching process that is selective to the (111) crystal plane.

Pairs of the quadrature tuning electrodes 420 are positioned on opposite sides of the resonator apparatus 100. The quadrature tuning electrodes 420 are configured to be applied with quadrature error cancellation voltages $V_{QA}$, $V_{QB}$. In response to application of the voltages $V_{QA}$, $V_{QB}$, the slanted quadrature tuning electrodes 420 are configured to produce a corresponding electrostatic force that provides a torque to move the resonator members 105a, 105b in a direction between the in-plane (IP) direction and an out-of-plane (OOP) direction that is orthogonal to the in-plane direction. Additional tuning electrodes 410, which are configured to be applied with out-of-plane tuning voltages $V_T$, are provided in the hollow internal sections within the perimeter 117b of the inner resonator member 105b.

Figure 4A:
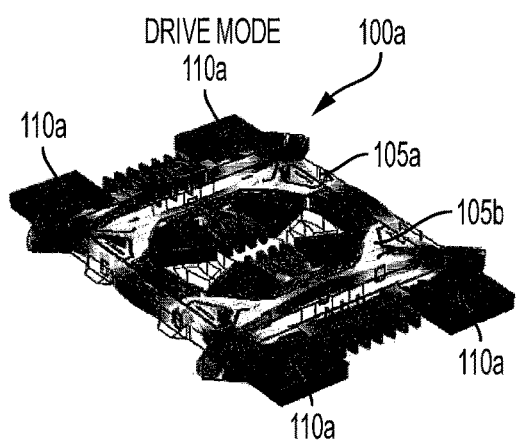
FIGS. 4A and 4B are perspective views illustrating displacement of resonator members in a drive mode and a sense mode, respectively, of the BAW resonator apparatus of FIG. 1 in accordance with some embodiments of the present disclosure.
Figure 4B:
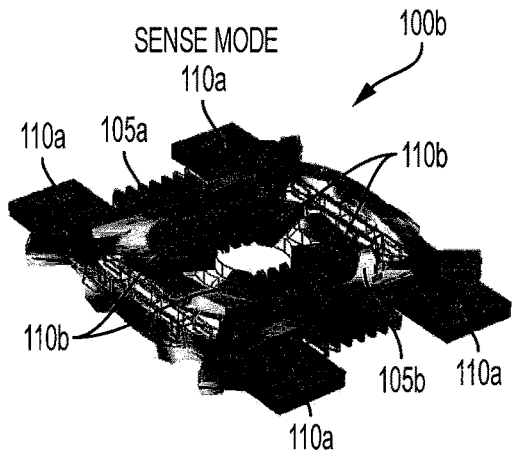
Figure 5:
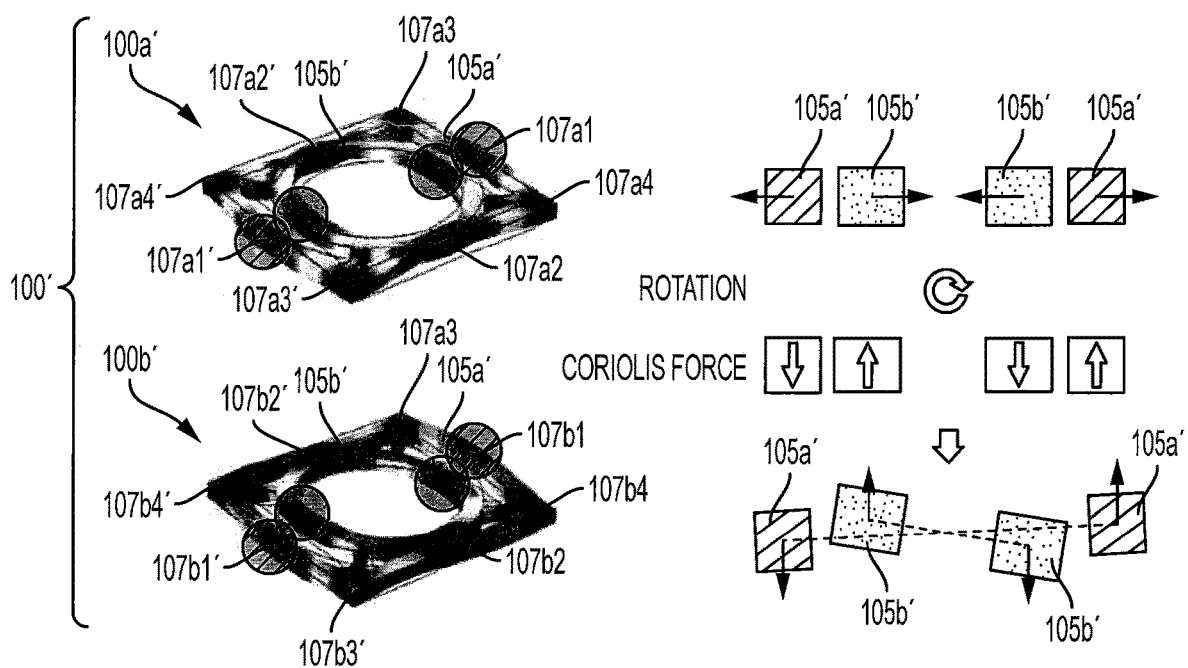
FIG. 5 illustrates Coriolis forces and displacement of a resonator member in an in-plane drive mode and an out-of-plane sense mode of a BAW resonator apparatus in accordance with some embodiments of the present disclosure.

FIGS. 4A and 4B are perspective views illustrating displacement of resonator members 105a, 105b in a drive mode 100a and a sense mode 100b, respectively, of the BAW resonator apparatus 100 of FIG. 1. FIG. 5 illustrates Coriolis forces and displacement of resonator members 105a', 105b' in two operational modes (the in-plane drive mode 100a' and an out-of-plane sense mode 100b') of a BAW resonator apparatus 100' in accordance with some embodiments of the present disclosure.

In the examples of FIGS. 4A and 4B, the BAW resonator apparatus 100 has high Coriolis coupling with an operational frequency of about 1 MHz. The in-plane resonance mode 100a shown in FIG. 4A is used as the drive mode, and the out-of-plane resonance mode 100b shown in FIG. 4B is used as the sense mode. The outer anchor structures 110a (and the corresponding outer tether structures 125a) are positioned outside of the perimeter 117a and are located at the nodal points of the apparatus 100 for both the drive mode 100a and the sense mode 100b. The inner anchors 110b (and the corresponding inner tether structures 125b) are positioned at nodal points of the sense mode 100b.

As shown in greater detail in FIG. 5, the outer anchor structures are positioned at nodal points 107a3, 107a3' and 107a4, 107a4' of the in-plane resonance mode 100a', which coincide with nodal points 107b3, 107b3' and 107b4, 107b4' of the out-of-plane resonance mode 100b'. The out-of-plane resonance mode 100b' may include additional nodal points 107b2, 107b2' that do not coincide with nodal points of the in-plane resonance mode 100a'. In some embodiments, the inner anchors are positioned at the nodal points 107b2, 107b2' of the out-of-plane resonance mode 100b'.

Still referring to FIG. 5, the anti-nodal points 107b1, 107b1' of the apparatus 100' in the out-of-plane resonance mode 100b' and the anti-nodal points 107a1, 107a1' of the apparatus 100' in the in-plane resonance mode 100a' coincide. In particular, in the substrate-decoupled high-Coriolis-coupling pitch/roll gyroscope 100' in accordance with embodiments of the present disclosure, the effective mass of the resonator members 105a', 105b' is distributed such that the anti-nodes 107b1, 107b1' for the out-of-plane resonance mode 100b' thereof coincide with the anti-nodes 107a1, 107a1' for the in-plane resonance mode 100a' thereof. Consequently, a Coriolis coupling coefficient up to approximately 1 can be achieved, as the Coriolis force on the resonator members 105a', 105b' produced by the in-plane mode 100a' under rotation coincides with the deformation of the resonator members 105a', 105b' responsive to the out-of-plane mode 100b' (or vice versa). However, it will be understood that not all of the anti-nodes of the in-plane mode 100a' need coincide with the out-of-plane mode 100b'. For example, the in-plane mode 100a' includes anti-nodes 107a2, 107a2' that do not coincide with or are otherwise not present in anti-nodes of the out-of-plane mode 100b'.

Compared to the tuning fork gyroscope TFG design of FIG. 8, the two frames 105a', 105b' with anti-phase of the BAW resonator apparatus 100' balance each other in both momentum and angular momentum. As such, the BAW resonator apparatus 100' can provide stand-alone operational modes that do not require balancing force from the anchors or substrate, and can be substrate-decoupled with anchor designs as described herein, as shown for example in FIG. 6. BAW resonator apparatus 100' in accordance with embodiments of the present disclosure can provide high operational frequency with low support loss $Q_{support}$, thus achieving high environmental robustness while having a high Coriolis coupling coefficient (up to 1). In some embodiments, a proof mass can be added to the coincided anti-nodal points to increase the effective mass and sensitivity, forming a self-balanced (substrate-decoupled) double-tuning fork gyroscope with lower operational frequency.

Figure 6:
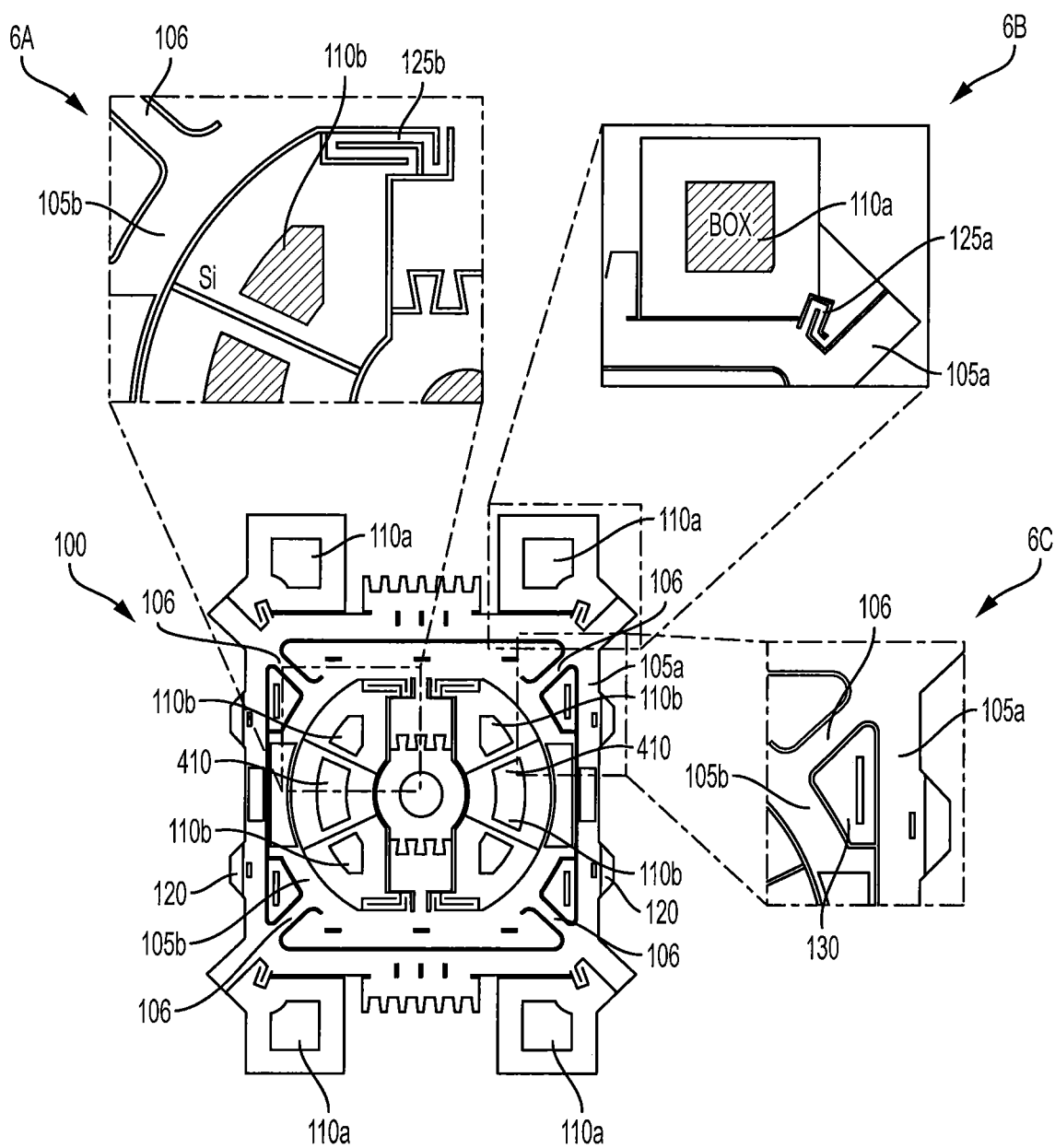
FIG. 6 is a plan view illustrating anchor configurations in the BAW resonator apparatus of FIG. 1 in accordance with some embodiments of the present disclosure.

FIG. 6 is a plan view illustrating anchor configurations in the BAW resonator apparatus 100 of FIG. 1, which contribute to the effective mass distribution discussed above with reference to FIG. 5. In particular, the BAW resonator apparatus 100 includes resonator members 105a, 105b, anchor structures 110a, 110b, tether structures 125a, 125b, and support structures 106 that are configured or otherwise arranged to distribute the effective mass of the apparatus 100 such that the anti-nodes of the resonator members 105a, 105b in the out-of-plane resonance mode 100b and the anti-nodes of the resonator members 105a, 105b in the in-plane resonance mode 100a substantially coincide, thereby providing the increased Coriolis coupling. In FIG. 6, enlarged view 6A illustrates the inner anchor structures 110b, enlarged view 6B illustrates the outer anchor structures 110a, and enlarged view 6C illustrates the support structures 106 in greater detail.

Enlarged view 6B of FIG. 6 illustrates that the outer anchor structures 110a include folded beams (shown as tethers 125a), which are positioned at the nodal points of both the in-plane resonance mode 100a and the out-of-plane resonance mode 100b shown in FIGS. 4A and 4B. These coincident nodal points are illustrated in the embodiment of FIG. 5 as nodal points 107a3, 107a3' and 107a4, 107a4' (in-plane) and nodal points 107b3, 107b3' and 107b4, 107b4' (out-of-plane). Enlarged view 6A of FIG. 6 illustrates that the inner anchor structures 110b include folded beams (shown as tethers 125b), which are positioned at or adjacent a central portion of the apparatus 100, to increase out-of-plane stiffness.

The anchor structures 110a, 110b are connected to the underlying substrate or handle layer 101, for example, by portions of the buried oxide layer 102 (as shown in FIG. 3). The outer resonator member 105a is not directly coupled to the substrate 101, but is suspended over the substrate 101 by the outer anchor structures 110a and outer tether structures 125a. Likewise, the inner resonator member 105b is not directly coupled to the substrate, but is suspended over the substrate 101 by the inner anchor structures 110b and inner tether structures 125b. The tether structures 125a may be portions of the outer resonator member 125a and outer anchor structures 110a that integrally extend therebetween in a serpentine manner such that portions thereof are "folded" or overlap. Likewise, the tether structures 125b may be portions of the inner resonator member 125b and inner anchor structures 110b that integrally extend therebetween in a serpentine manner such that portions thereof are "folded" or overlap. The arrangement and configurations of the anchor structures 110a, 110b and tether structures 125a, 125b thus provide decoupling of the resonator members 105a, 105b from the underlying substrate 101 at resonant frequencies for both the in-plane mode of vibration 100a and the out-of-plane mode of vibration 100b, while providing rigidity for translational motions, and rejection of undesired deformations.

Still referring to FIG. 6, enlarged view 6C illustrates that the support structures 106 (illustrated as flexible support beams) extend between the inner resonator member 105b and the outer resonator member 105a at inner corner locations of the rectangular-shaped outer resonator member 105a. In some embodiments, the support structures 106 may extend between the outer and inner anchor structures 110a and 110b. For example, the support structures 106 may be coupled to an inner perimeter of the outer resonator member 105a at locations opposite to those of the outer anchor structures 110a. The substrate or handle layer 101 may be grounded through polysilicon plugs 130, which may provide better gyroscope stability.

The BAW resonator apparatus 100 including resonator members 105a, 105b, anchor structures 110a, 110b, tether structures 125a, 125b, and support structures 106 as shown in FIG. 6 may have low support loss while remaining rigid in multiple directions for high vibration rejection. As described herein, support loss may refer to energy leakage to the substrate 101 through the anchor structures. In substrate-decoupled designs in accordance with embodiments described herein, the resonator member is isolated from the substrate, thereby reducing support loss. $Q_{support}$ may be used herein to refer to the quality factor limit due to support loss, that is, the lower the support loss, the higher the value of $Q_{support}$. In particular embodiments described herein, a Coriolis coupling coefficient of 0.85 may be achieved while being substrate decoupled with $Q_{support}$ exceeding $6 \times 10^6$ (for example, greater than about $6.5 \times 10^6$). Embodiments of the present disclosure may therefore provide advantages over conventional tuning-fork and annulus pitch/roll gyroscope designs, which may have lower vibration resistance and environmental reliability.

Figure 7:
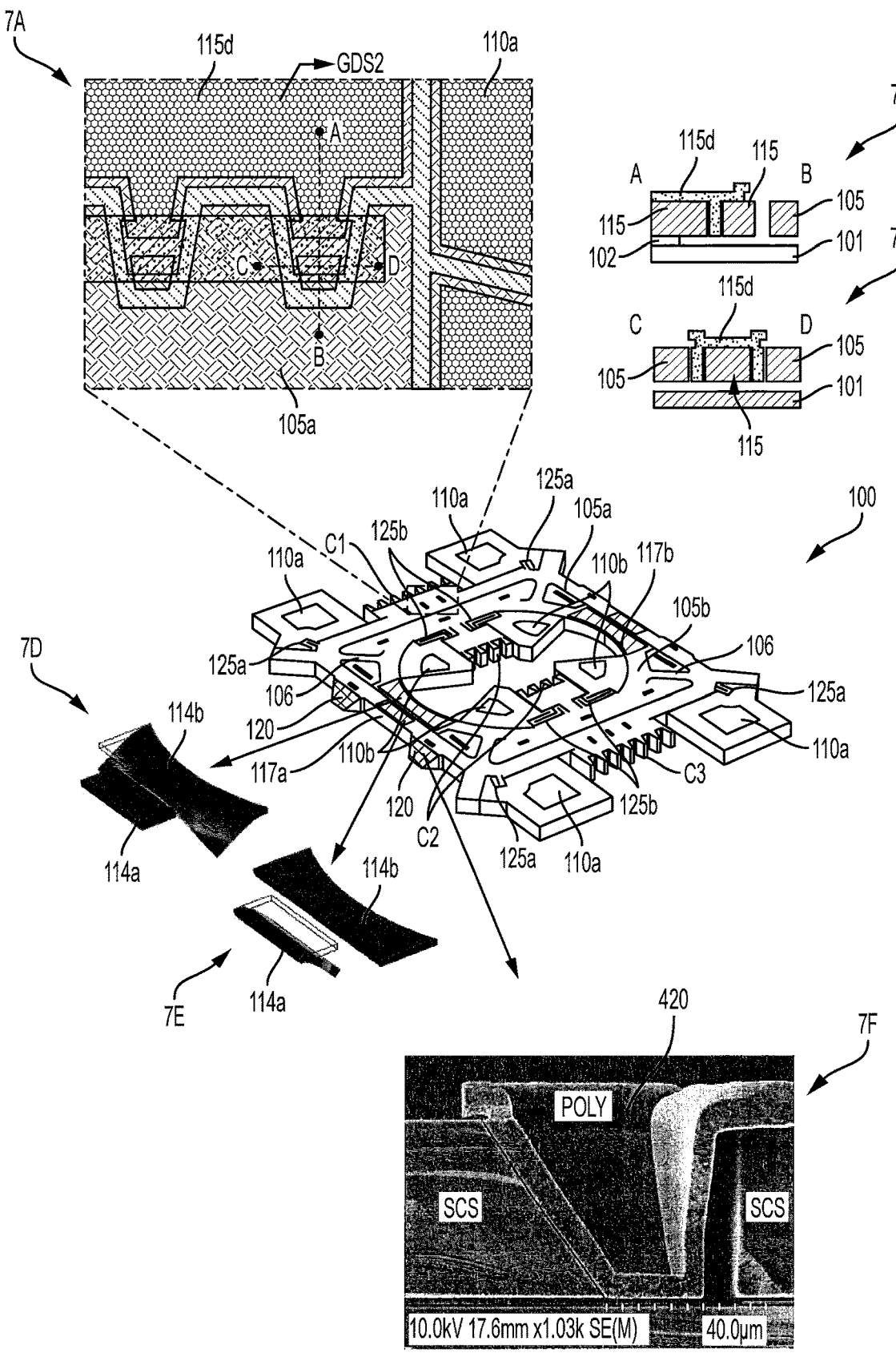
FIG. 7 is a plan view illustrating electrode configurations in the BAW resonator apparatus of FIG. 1 in accordance with some embodiments of the present disclosure.

FIG. 7 is a plan view illustrating electrode configurations in the BAW resonator apparatus 100 of FIG. 1. As shown in FIGS. 2 and 7, the apparatus 100 includes comb-drive actuation electrodes 115d, 115a, 115b, sense electrodes 114a, tuning electrodes 114b, and slanted quadrature tuning electrodes 420, which can be integrated into the design of the resonator apparatus 100 without distorting the mode shape in some embodiments. For example, the resonator members 105a, 105b, comb finger portions 105, 115, and anchors 110a, 110b, may be formed from single-crystal silicon (SCS) and the comb-drive actuation electrodes 115d, 115a, 115b, sense electrodes 114a, tuning electrodes 114b, and slanted quadrature tuning electrodes 420 may be formed from polysilicon using a high-aspect-ratio polysilicon and single-crystal silicon (HARPSS)™ process. In FIG. 7, enlarged view 7A is a plan view of the actuation electrode 115a; enlarged views 7B and 7C are cross-sectional views of the actuation electrode 115a taken along lines A-B and C-D of enlarged view 7A, respectively; enlarged views 7D and 7E illustrate deformation of one of the tuning electrodes 114b and one of the sense electrodes 114a, respectively; and enlarged view 7F is a cross-sectional view scanning electron microscope (SEM) image of one of the quadrature tuning electrodes 420.

As shown in enlarged views 7A, 7B, and 7C, a nano-gap comb-drive actuator can be implemented to actuate the resonator members 105a, 105b of a Coriolis pitch/roll gyroscope 100 with n=2 in-plane wineglass mode as drive mode (FIG. 4A) and an out-of-plane mode as sense mode (FIG. 4B). A comb-drive electrode 115d is electrically coupled to a sidewall of the outer resonator member 105a including first comb finger portions 105 protruding from the perimeter 117a, and is configured to actuate movement of the resonator members 105a, 105b. A comb-drive electrode 115a is connected to the perimeter 117a opposite to the comb-drive electrode 117d, and a comb-drive electrode 115b is connected within the perimeter 117b of the inner resonator member 105b, which are configured to detect movement of the resonator members 105a, 105b.

The comb-drive electrode 115d may be a polysilicon layer extending on top of and/or between second comb finger portions 115, which are interdigitated with the first comb finger portions 105 to define sub-micron capacitive gaps 170g therebetween. The in-plane comb drive electrode 115d may provide a linear actuation range of about 150 nm or less. In the example of FIG. 7, the drive electrode 115d provides a single-end drive C1, while sense electrodes 115a, 115b provide a differential output C2, C3. The gap 170g may be about 270 nm or less. Portions of the comb fingers 115 may connect the comb drive electrode 115d to a portion of a buried oxide layer 102 on the substrate 101. Further details regarding fabrication and operation of the comb drive are described in International Patent Application No. PCT/US2016/0059408 entitled "COMB-DRIVEN SUBSTRATE DECOUPLED ANNULUS PITCH/ROLL BAW GYROSCOPE WITH SLANTED QUADRATURE TUNING ELECTRODE" and filed Oct. 28, 2016, in the United States Patent and Trademark Office, the disclosure of which is incorporated by reference herein in its entirety.

Enlarged views 7D and 7E illustrate the top polysilicon sense electrodes 114a and tuning electrodes 114b (with the deformation of the lowest-frequency mode of each). The sense electrodes 114a provide a differential output, and the tuning electrodes 114b can achieve a tuning range of about 19 kHz for 0.5V-15.5V with Vp=20V. The top polysilicon electrodes 114a, 114b may have a thickness of about 6.5 μm, and resonance frequencies of about 3.4 MHz to about 4.9 MHz in some embodiments, which is well above the gyro operational frequency. Capacitive gap sizes between the top polysilicon electrodes 114a, 114b and the surfaces of the outer and inner resonator members 105a, 105b may be about 270 nm or less. In some embodiments, the electrodes 114a, 114b may also be used for differential output (with modifications to the electrode sizes).

Enlarged view 7F illustrates that the slanted quadrature electrodes 420 may be positioned along the perimeter 117a of the outer resonator member 105a at respective sidewalls 120 that are slanted at an angle relative to a plane defined by a surface of the resonator member 105a, where the angle corresponds to or is otherwise adapted to mate with the slanted quadrature tuning electrodes 420, defining a uniform capacitive gap therebetween. The quadrature tuning electrodes 420 are configured to be applied with quadrature error cancellation voltages $V_{QA}$, $V_{QB}$, as shown in FIG. 2. In response to application of the voltages $V_{QA}$, $V_{QB}$, the slanted quadrature tuning electrodes 420 are configured to produce a corresponding electrostatic force that provides a torque to move the resonator members 105a, 105b in a direction between the in-plane (IP) direction and an out-of-plane (OOP) direction that is orthogonal to the in-plane direction.

In particular, in annulus BAW gyroscopes, imperfections like DRIE trench tilting can cause cross-coupling between in-plane and out-of-plane modes (quadrature), which can prevent mode-matching and can degrade noise performance. Some embodiments of the present disclosure may implement slanted sidewalls 120 and slanted electrodes 420 used for quadrature error cancellation. In some embodiments, the slanted sidewalls 120 are fabricated by a post-DRIE anisotropic silicon wet etching. The gap size of the capacitive gaps between the slanted sidewalls 120 and the slanted sidewalls of the electrode 420 is selected or otherwise configured based on both in-plane and out-of-plane motion, which can allow for quadrature tuning.

The slanted quadrature tuning electrodes 420 may be positioned at off-maximum tuning locations around the perimeter 117a of the outer resonator member 105a, which may reduce changes in the capacitive gap size under larger drive amplitudes. For example, capacitive gap sizes for the quadrature tuning electrodes may be about 270 nm or less, and may change less than about 60% of the drive amplitude. Actuation of the quadrature tuning electrodes 420 can thereby compensate for about +/−0.3 degrees of DRIE trench tilting with 0.5V-15.5V tuning voltages $V_{QA}$, $V_{QB}$. In some embodiments, a quadrature tuning voltage $V_{QA}$, $V_{QB}$ of about 8V may be used to cover trench tilting of about 0.3 degrees. Additional tuning electrodes 410, which are configured to be applied with out-of-plane tuning voltages $V_T$, are provided in the hollow internal sections within the perimeter 117b of the inner resonator member 105b. Additional features of slanted quadrature tuning electrodes are described in International Patent Application Nos. PCT/US2017/036329 entitled "PITCH/ROLL ANNULUS GYROSCOPE WITH SLANTED QUADRATURE TUNING ELECTRODES AND RELATED FABRICATION METHODS", filed Jun. 7, 2017, and PCT/2016/37186 entitled "MEMS INERTIAL MEASUREMENT APPARATUS HAVING SLANTED ELECTRODES FOR QUADRATURE TUNING," filed Jun. 13, 2016, the disclosures of which are incorporated by reference herein in their entireties.

As mentioned above, while some conventional MEMS gyroscopes may have low vibration resistance and environmental reliability, embodiments of the present disclosure provide pitch/roll gyroscopes having substrate-decoupled high-frequency resonance modes (which improve reliability), as well as operational modes with high Coriolis coupling (which improve both scale factor and noise performance). Embodiments of the present disclosure may be used to realize high-performance single-chip inertial measurement units (IMUs), for example, by allowing integration of multi-axial high-frequency gyroscopes on a common substrate.

For example, the apparatus 100 may include or be part of an IMU, where the resonator members 105a, 105b may be a first resonator member of a first gyroscope, and a second resonator member of a second gyroscope having outer and inner resonator members may be disposed on the substrate 101 adjacent the first resonator member. The second resonator member may be suspended over the substrate 101 by respective anchor structures. Embodiments described herein may thus be suitable and offer advantages for high precision inertial sensor applications, including but not limited to indoor navigation.

The present inventive concepts have been described with reference to the accompanying drawings, in which embodiments of the inventive concepts are shown. However, the present disclosure should not be construed as limited to the embodiments set forth herein. Rather, these embodiments are provided so that this disclosure will be thorough and complete, and to fully convey the scope of the embodiments to those skilled in the art. Like reference numbers refer to like elements throughout.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, elements, and/or components, but do not preclude the presence or addition of one or more other features, steps, elements, components, and/or groups thereof. As used herein, the term "and/or" includes any and all combinations of one or more of the associated listed items, and may be abbreviated as "/."

It will also be understood that when an element is referred to as being "on," "coupled to," "connected to," or "responsive to" another element, it can be directly "on," "coupled to," "connected to," or "responsive to" the other element, or intervening elements may be present. In contrast, when an element is referred to as being "directly on," "directly coupled to," "directly connected to," or "directly responsive to" another element, there are no intervening elements present. It will also be understood that the sizes and relative orientations of the illustrated elements are not shown to scale, and in some instances they have been exaggerated for purposes of explanation.

Spatially relative terms, such as "above," "below," "upper," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. Well-known functions or constructions may not be described in detail for brevity and/or clarity.

It will be understood that, although the terms "first," "second," etc. may be used herein to describe various elements, these elements should not be limited by these terms. These terms are only used to distinguish one element from another. Thus, a first element could be termed a second element without departing from the teachings of the present embodiments.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which these embodiments belong. It will be further understood that terms, such as those defined in commonly-used dictionaries, should be interpreted as having a meaning that is consistent with their meaning in the context of the relevant art and will not be interpreted in an idealized or overly-formal sense unless expressly so defined herein.

The foregoing is illustrative of the present disclosure and is not to be construed as limiting thereof. Although a few exemplary embodiments have been described, those skilled in the art will readily appreciate that many modifications are possible in the exemplary embodiments without materially departing from the teachings and advantages of the inventive concepts. Accordingly, all such modifications are intended to be included within the scope of the inventive concepts as defined in the claims.

That which is claimed:

1. A pitch or roll gyroscope, comprising:
   a resonator member; and
   at least one anchor structure connected to a substrate and suspending the resonator member over a surface thereof such that the resonator member is decoupled from the substrate for an in-plane resonance mode thereof comprising movement parallel to the surface of the substrate and an out-of-plane resonance mode thereof comprising movement non-parallel to the surface of the substrate, wherein a Coriolis force on the resonator member in the in-plane resonance mode thereof coincides with deformation of the resonator member in the out-of-plane resonance mode thereof;
   wherein the resonator member includes concentric frame members that are mechanically coupled together by rigid support structures extending therebetween; and
   wherein opposing ends of each of the rigid support structures correspond to respective nodes of the resonator member that experience a minimum of modal displacement during the in-plane resonance mode.

2. The pitch or roll gyroscope of claim 1, wherein the in-plane resonance mode and the out-of-plane resonance mode are two Coriolis-coupled resonance modes supported by the gyroscope at: (i) a high Coriolis-coupling coefficient in a range from greater than about two-thirds to 1, and (ii) with a sufficiently low support loss resulting from energy leakage to the substrate that $Q_{support}$ exceeds $6 \times 10^6$, where $Q_{support}$ corresponds to a quality factor limit caused by the support loss.

3. The pitch or roll gyroscope of claim 1, wherein an effective mass of the resonator member is distributed such that anti-nodal points of the resonator member for the out-of-plane resonance mode thereof coincide with anti-nodal points of the resonator member for the in-plane resonance mode thereof; and wherein the in-plane resonance mode and the out-of-plane resonance mode are two Coriolis-coupled resonance modes supported by the gyroscope at a high Coriolis-coupling coefficient in a range from greater than about two-thirds to 1.

4. The pitch or roll gyroscope of claim 3, wherein the concentric frame members have annular or rectangular shapes that are mechanically coupled together by four of the rigid support structures, wherein the concentric frame members are balanced in momentum and angular momentum for the in-plane resonance mode and the out-of-plane resonance mode; and wherein the four rigid support structures comprise semiconductor beam structures.

5. The pitch or roll gyroscope of claim 1, wherein the at least one anchor structure comprises:
outer anchors that are outside of a perimeter of the resonator member and are positioned at nodal points of the resonator member for the in-plane resonance mode thereof that coincide with nodal points of the resonator member for the out-of-plane resonance mode thereof; and
inner anchors connected by respective flexible tethers to an innermost one of the concentric frame members and to a corresponding portion of a comb-drive element associated with a sense electrode, which is located within a perimeter of the innermost one of the concentric frame members; and
wherein the outer anchors do not provide a balancing force on the resonator member for the in-plane resonance mode and the out-of-plane resonance mode.

6. A pitch or roll gyroscope, comprising:
a resonator member including concentric frame members that are mechanically coupled together by rigid support structures extending therebetween; and
at least one anchor structure connected to a substrate and suspending the resonator member over a surface thereof such that the resonator member is decoupled from the substrate for an in-plane resonance mode thereof comprising movement parallel to the surface of the substrate and an out-of-plane resonance mode thereof comprising movement non-parallel to the surface of the substrate, wherein a Coriolis force on the resonator member in the in-plane resonance mode thereof coincides with deformation of the resonator member in the out-of-plane resonance mode thereof;
wherein the at least one anchor structure includes a plurality of outer anchors that are connected to an outer one of the concentric frame members at nodes of the resonator member for the in-plane resonance mode where movement of the resonator member in the in-plane resonance mode is parallel to the surface of the substrate; and
wherein a plurality of regions within an inner one of the concentric frame members undergo deformation in opposite directions relative to a corresponding plurality of regions within the outer one of the concentric frame members, for both the in-plane resonance mode and the out-of-plane resonance mode.

7. The gyroscope of claim 6, wherein the nodes of the resonator member for the in-plane resonance mode coincide with nodes of the resonator member for the out-of-plane resonance mode where movement of the resonator member in the out-of-plane resonance mode is non-parallel to the surface of the substrate.

8. The gyroscope of claim 6, wherein the outer one of the concentric frame members is a rectangular frame; and wherein an inner one of the concentric frame members is an annular frame.

9. The gyroscope of claim 6, wherein the at least one anchor structure includes a plurality of inner anchors that are connected to an innermost one of the concentric frame members at additional nodes of the resonator member for the out-of-plane resonance mode, where the additional nodes do not coincide with the nodes of the resonator member for the in-plane resonance mode.

10. The gyroscope of claim 9, wherein the outer one of the concentric frame members is a rectangular frame; and wherein the innermost one of the concentric frame members is an annular frame.

11. The gyroscope of claim 6, wherein the in-plane resonance mode and the out-of-plane resonance mode are two Coriolis-coupled resonance modes supported by the gyroscope at a high Coriolis-coupling coefficient in a range from greater than about two-thirds to 1.

12. The gyroscope of claim 6, wherein the in-plane resonance mode and the out-of-plane resonance mode are two Coriolis-coupled resonance modes supported by the gyroscope at: (i) a high Coriolis-coupling coefficient in a range from greater than about two-thirds to 1, and (ii) with a sufficiently low support loss resulting from energy leakage to the substrate that $Q_{support}$ exceeds $6 \times 10^6$, where $Q_{support}$ corresponds to a quality factor limit caused by the support loss.

13. The gyroscope of claim 6, wherein the concentric frame members are mechanically coupled together by four rigid support structures; and wherein opposing ends of each of the four rigid support structures correspond to respective nodes of the resonator member that experience a minimum of modal displacement during the in-plane resonance mode.

14. The gyroscope of claim 6, wherein opposing ends of each of the rigid support structures correspond to respective nodes of the resonator member that experience a minimum of modal displacement during the in-plane resonance mode.

15. A pitch or roll gyroscope, comprising:
a resonator member including concentric frame members that are mechanically coupled together by rigid support structures extending therebetween; and
at least one anchor structure connected to a substrate and suspending the resonator member over a surface thereof such that the resonator member is decoupled from the substrate for an in-plane resonance mode thereof comprising movement parallel to the surface of the substrate and an out-of-plane resonance mode thereof comprising movement non-parallel to the surface of the substrate, wherein a Coriolis force on the resonator member in the in-plane resonance mode thereof coincides with deformation of the resonator member in the out-of-plane resonance mode thereof;
wherein the at least one anchor structure includes a plurality of outer anchors that are connected to an outer one of the concentric frame members at nodes of the resonator member for the in-plane resonance mode where movement of the resonator member in the in-plane resonance mode is parallel to the surface of the substrate;

wherein the concentric frame members are mechanically coupled together by four rigid support structures; and wherein opposing ends of each of the four rigid support structures correspond to respective nodes of the resonator member that experience a minimum of modal displacement during the in-plane resonance mode.

\* \* \* \* \*